(12) United States Patent
Wilson et al.

(10) Patent No.: US 7,017,651 B1
(45) Date of Patent: Mar. 28, 2006

(54) METHOD AND APPARATUS FOR TEMPERATURE GRADIENT CONTROL IN AN ELECTRONIC SYSTEM

(75) Inventors: James S. Wilson, Hurst, TX (US); Timothy C. Fletcher, Garland, TX (US); Lucian A. Braiser, Plano, TX (US); James S. Mason, Richardson, TX (US)

(73) Assignee: Raytheon Company, Waltham, MA (US)

( * ) Notice: Subject to any disclaimer, the term of this patent is extended or adjusted under 35 U.S.C. 154(b) by 249 days.

(21) Appl. No.: 09/660,733

(22) Filed: Sep. 13, 2000

(51) Int. Cl.
*F28F 13/12* (2006.01)
(52) U.S. Cl. ............ 165/47; 165/109.1; 165/133; 165/80.4; 361/688; 361/715; 174/252
(58) Field of Classification Search ............... 165/133, 165/109.1, 47, 80.4, 267, 146, 177, 179, 165/264, 122; 137/340; 174/252, 255; 361/690, 688, 704, 707, 709, 711, 712, 715, 361/716, 714, 720, 721
See application file for complete search history.

(56) References Cited

U.S. PATENT DOCUMENTS

| | | | | |
|---|---|---|---|---|
| 2,688,467 A | * | 9/1954 | Leatzow | 165/146 |
| 3,277,346 A | * | 10/1966 | McAdam et al. | 361/697 |
| 3,360,032 A | * | 12/1967 | Sherwood | 165/264 |
| 3,631,819 A | * | 1/1972 | Houchman | 165/146 |
| 3,779,312 A | * | 12/1973 | Withers et al. | 138/122 |
| 3,826,304 A | * | 7/1974 | Withers et al. | 165/179 |
| 4,103,737 A | | 8/1978 | Perkins | 165/109.1 |
| 4,188,996 A | * | 2/1980 | Pellant et al. | 165/80.4 |
| 4,222,434 A | * | 9/1980 | Clyde | 165/109.1 X |
| 4,332,294 A | * | 6/1982 | Drefahl et al. | 165/177 X |
| 4,353,350 A | * | 10/1982 | Albrecht | 165/109.1 X |
| 4,366,497 A | * | 12/1982 | Block et al. | 165/80.4 X |
| 4,851,856 A | * | 7/1989 | Altoz | |
| 5,111,280 A | * | 5/1992 | Iversen | 165/80.4 X |
| 5,140,335 A | * | 8/1992 | Staehlin et al. | |
| 5,269,372 A | * | 12/1993 | Chu et al. | 165/80.4 |
| 5,271,376 A | * | 12/1993 | Lu et al. | 165/109.1 X |
| 5,375,654 A | * | 12/1994 | Hougland et al. | 165/109.1 |
| 5,573,062 A | * | 11/1996 | Ooba et al. | 165/179 X |
| 5,666,269 A | * | 9/1997 | Romero et al. | 165/80.4 X |
| 5,680,772 A | * | 10/1997 | Furukawa et al. | 165/179 |
| 5,812,372 A | * | 9/1998 | Galyon et al. | 165/80.4 X |
| 5,829,516 A | * | 11/1998 | Lavochkin | 165/80.4 |
| 5,833,450 A | * | 11/1998 | Wunning | 165/109.1 X |
| 5,835,345 A | * | 11/1998 | Staskus et al. | 165/80.4 X |
| 5,839,505 A | * | 11/1998 | Ludwig et al. | 165/109.1 |
| 5,915,463 A | * | 6/1999 | Romero et al. | 165/80.4 X |
| 5,960,866 A | | 10/1999 | Kimura et al. | |
| 5,983,997 A | * | 11/1999 | Hou | 165/80.4 X |
| 6,067,712 A | * | 5/2000 | Randlett et al. | 165/109.1 X |

(Continued)

FOREIGN PATENT DOCUMENTS

CA          587174      * 11/1959 ................. 165/146

(Continued)

*Primary Examiner*—Ljiljana Ciric
(74) *Attorney, Agent, or Firm*—Baker Botts L.L.P.

(57) ABSTRACT

An apparatus includes a plurality of Transmit/Receive (T/R) modules (20) coupled with a slat assembly (34). The slat assembly includes a fluid passageway (54). A plurality of turbulence inducing structures (62, 162, 262, 104, 204, 304, 462) are disposed within the fluid passageway. In one embodiment, the turbulence inducing structures includes constrictions (62) extending from a surface (55) of the fluid passageway. The location and configuration of the structures is selected to achieve a predetermined temperature profile along the passageway, in response to fluid flow through the fluid passageway.

20 Claims, 6 Drawing Sheets

U.S. PATENT DOCUMENTS

| | | | |
|---|---|---|---|
| 6,158,232 A * | 12/2000 | Tsuji et al. | 165/80.4 X |
| 6,184,832 B1 * | 2/2001 | Geyh et al. | |
| 6,257,320 B1 * | 7/2001 | Wargo | 165/80.4 |
| 6,292,364 B1 * | 9/2001 | Fitzgerald et al. | 165/80.4 X |
| 6,299,657 B1 * | 10/2001 | Schubert et al. | 165/109.1 X |
| 6,330,153 B1 * | 12/2001 | Ketonen et al. | 361/690 |
| 6,366,461 B1 * | 4/2002 | Pautsch et al. | 361/690 |
| 6,469,671 B1 * | 10/2002 | Pluymers et al. | 343/702 |
| 6,550,533 B1 * | 4/2003 | Nakado et al. | 165/177 |

FOREIGN PATENT DOCUMENTS

| | | | | |
|---|---|---|---|---|
| DE | 240 986 A1 * | 11/1986 | | 165/80.4 |
| DE | 37 39 585 | 5/1989 | | |
| DE | 198 60 415 | 6/2000 | | |
| EP | 0 114 640 A2 * | 8/1984 | | 165/179 |
| EP | 0 942 640 | 9/1999 | | |
| GB | 758524 | * | 10/1956 | 165/80.4 |
| GB | 2159265 A | * | 11/1985 | 165/109.1 |
| GB | 2 225 170 A | * | 5/1990 | |
| JP | 60-185094 | * | 9/1985 | 165/146 |
| JP | 60-185095 | * | 9/1985 | 165/146 |
| JP | 61-265499 | * | 11/1986 | 165/179 |
| JP | 62-242795 | * | 10/1987 | 165/179 |
| JP | 11-317618 | * | 11/1999 | |
| SU | 989301 | | 1/1983 | |
| SU | 1245851 A1 | * | 7/1986 | 165/179 |
| SU | 1288483 A2 | * | 2/1987 | 165/179 |
| WO | 91/02207 | * | 2/1991 | 165/146 |
| WO | WO 97/15801 | | 5/1997 | |
| WO | WO 01/63667 | | 8/2001 | |

* cited by examiner

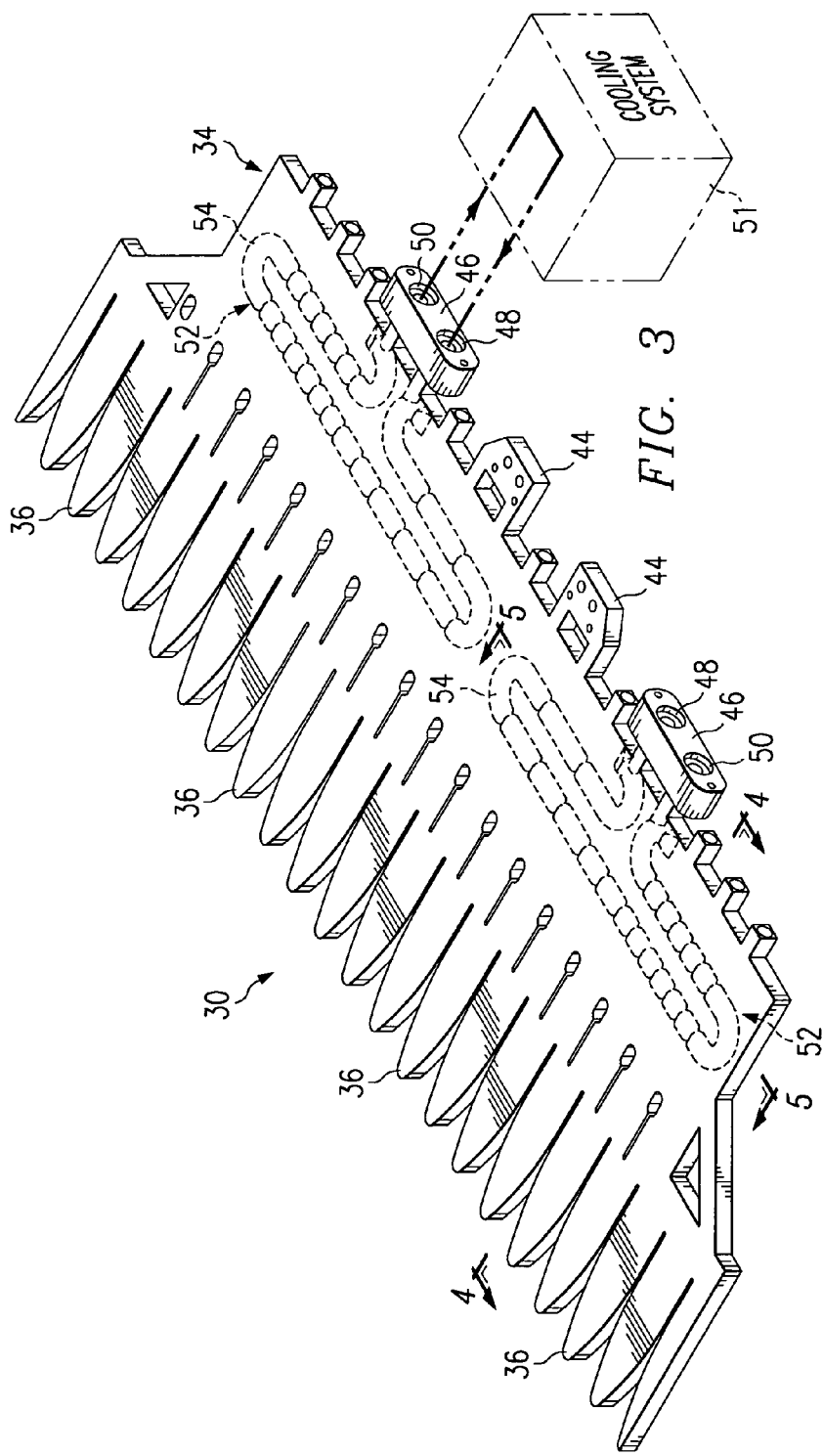
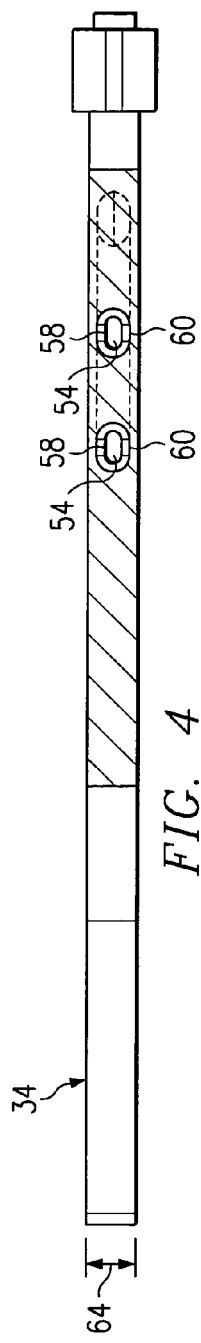
FIG. 3
FIG. 4

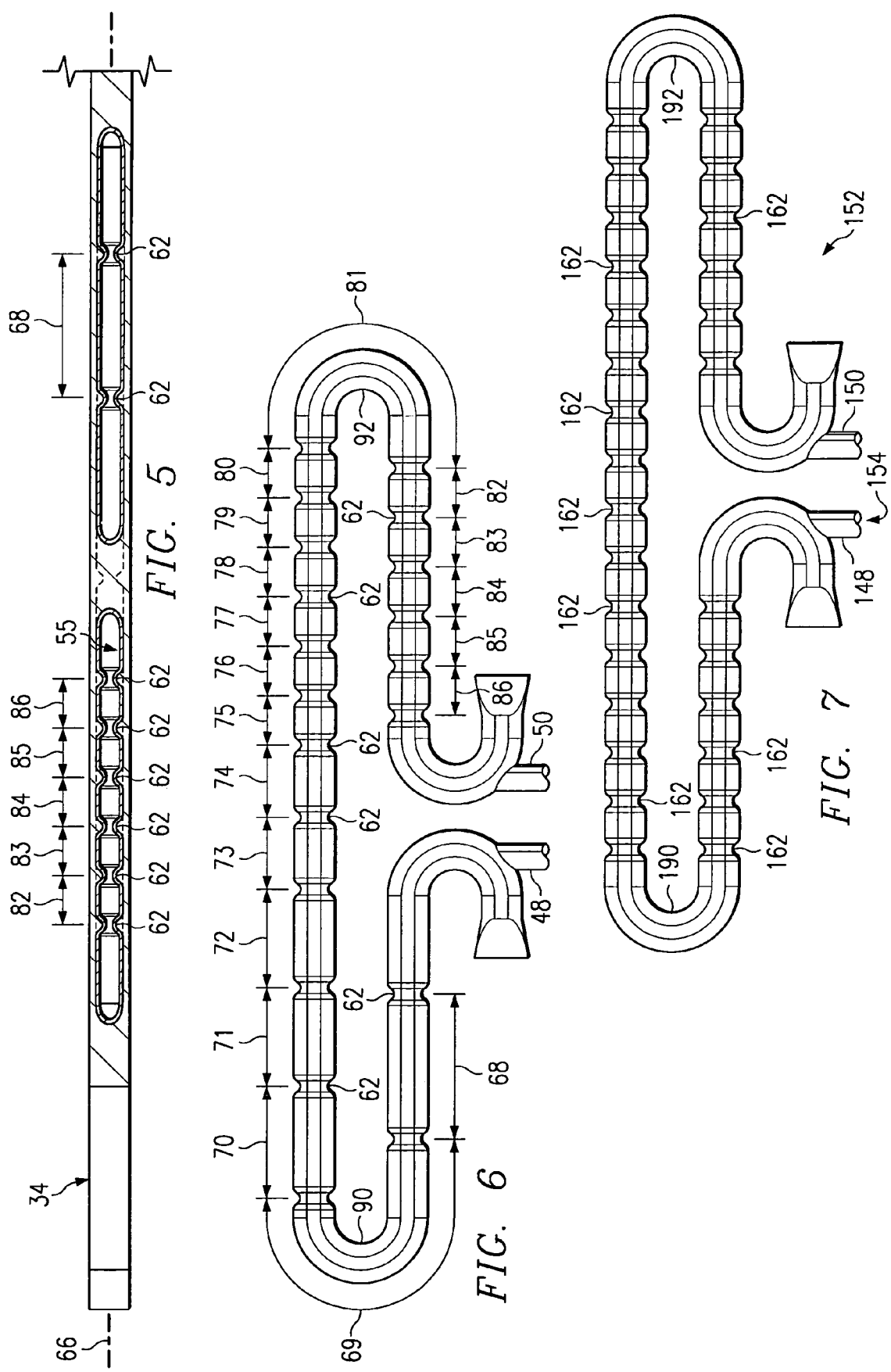

METHOD AND APPARATUS FOR TEMPERATURE GRADIENT CONTROL IN AN ELECTRONIC SYSTEM

TECHNICAL FIELD OF THE INVENTION

The present invention relates generally to temperature control of a device and, more particularly, to a method and apparatus for controlling temperature gradients across components of an electronic system.

BACKGROUND OF THE INVENTION

The design of electronic packages and systems must address electrically generated heat dissipation within operating devices to ensure proper operation. For example, most electronic devices must be maintained below predetermined maximum temperatures to allow acceptable performance and reliability. With regard to microwave electronic systems (e.g. power amplifiers, phase shifters, low noise amplifiers), electronic components may also be sensitive to temperature gradients between associated electronics devices, for example monolithic microwave integrated circuits (MMICs). Such components must be maintained within predetermined maximum temperature gradients from device to device.

Accordingly, cooling systems are typically incorporated into such electronic systems. Cooling systems are configured to absorb heat and lower the temperature of the electronic system generally, and resist excessive temperature gradients between particular devices of the electronic package. A typical cooling system often includes a metal cold plate coupled with electronic devices. Oftentimes, the cold plate contains brazed-on finstock to increase the heat transfer surface area. This solution is very expensive and requires a complicated design and fabrication procedure for the cold plate.

Another approach utilizes a liquid coolant routed through channels embedded in the cold plate, in order to accommodate heat transfer from the electronic devices to the liquid coolant. This eliminates the need for expensive finstock brazing. However, the power, density and sensitivity of today's electronic packages has limited the efficiency and practicality of this approach.

One example of the foregoing type of system is a phased array antenna system. Phased array antenna systems are used in a wide variety of applications and often include electronics systems with integral cooling systems. In a phased array antenna system it is desirable that the antenna system be relatively small in volume and relatively light in weight. Antenna systems of this type often include MMICs, which generate a substantial amount of heat during operation. As the frequency of antenna operation increases, there is an increase in the amount of heat which is emitted by these circuits, which in turn can affect temperature gradients across the array.

In particular, in a phased array antenna system, the existence of temperature gradients across the array can produce phase errors, which affect the accuracy of the antenna system. The higher the frequency of antenna operation, the smaller the permissible temperature gradients across the array. For example, where the phased array is operating at a frequency of about 5 GHz, the maximum allowable temperature gradient across the array is about 20° C. In contrast, when the array is operating at a frequency of about 80 GHz, the maximum allowable temperature gradient across the array is only about 1.3° C. Thus, it is important to have an efficient cooling system, so that a substantially uniform temperature is maintained across the array.

As a further complication, many electronic systems have a limited supply of coolant available for the cooling system. For example, various different cooling systems on an aircraft often share a common cooling system, and a particular system's access to the coolant is limited. The performance of such systems often suffer from low coolant flow rates which provide limited heat transfer ability. Furthermore, low volumetric flow rates result in a significant temperature rise in the coolant as it flows from an inlet to an outlet of a cold plate. Rising coolant temperatures result in undesirably large temperature gradients between various portions of the electronic system.

In order to overcome this, complex fluid manifolds have been designed in order to allow each device to be cooled with only its proportional amount of coolant, in a completely parallel distribution. However, this approach is bulky and fundamentally less efficient from a heat transfer standpoint because of the low fluid coolant velocity.

SUMMARY OF THE INVENTION

From the foregoing, it will be appreciated that a need has arisen for a method and apparatus for cooling an apparatus in a manner which accurately controls temperature gradients. According to the present invention, a method and apparatus are provided to meet this need.

In accordance with one form of the present invention, a thermally conductive part has a fluid passageway formed therein. Turbulence inducing structure is disposed along the fluid passageway in a manner selected to achieve a predetermined temperature profile along the passageway in material of the part adjacent to the fluid passageway, in response to fluid flow through the fluid passageway.

In accordance with another form of the present invention a thermally conductive flat plate has a fluid passageway formed therein. Turbulence inducing structures are disposed along the fluid passageway.

BRIEF DESCRIPTION OF THE DRAWINGS

For a more complete understanding of the present invention and its advantages, reference is now made to the following description, taken in conjunction with the accompanying drawings, in which:

FIG. 3 is a diagrammatic perspective view, with portions broken away, of the slat assembly of FIG. 2, having cooling loops disposed therein;

FIG. 4 is a diagrammatic sectional view of the slat assembly of FIG. 3, taken along the line 4—4 in FIG. 3;

FIG. 5 is a diagrammatic sectional view of the slat assembly of FIG. 3, taken along the line 5—5 in FIG. 3;

FIG. 6 is a diagrammatic plan view of one of the cooling loops of FIG. 3;

FIG. 7 is a diagrammatic plan view of an alternative embodiment of the cooling loop of FIG. 5, which is suitable for use with the slat assembly of FIG. 4;

DETAILED DESCRIPTION OF THE INVENTION

Figure 1:
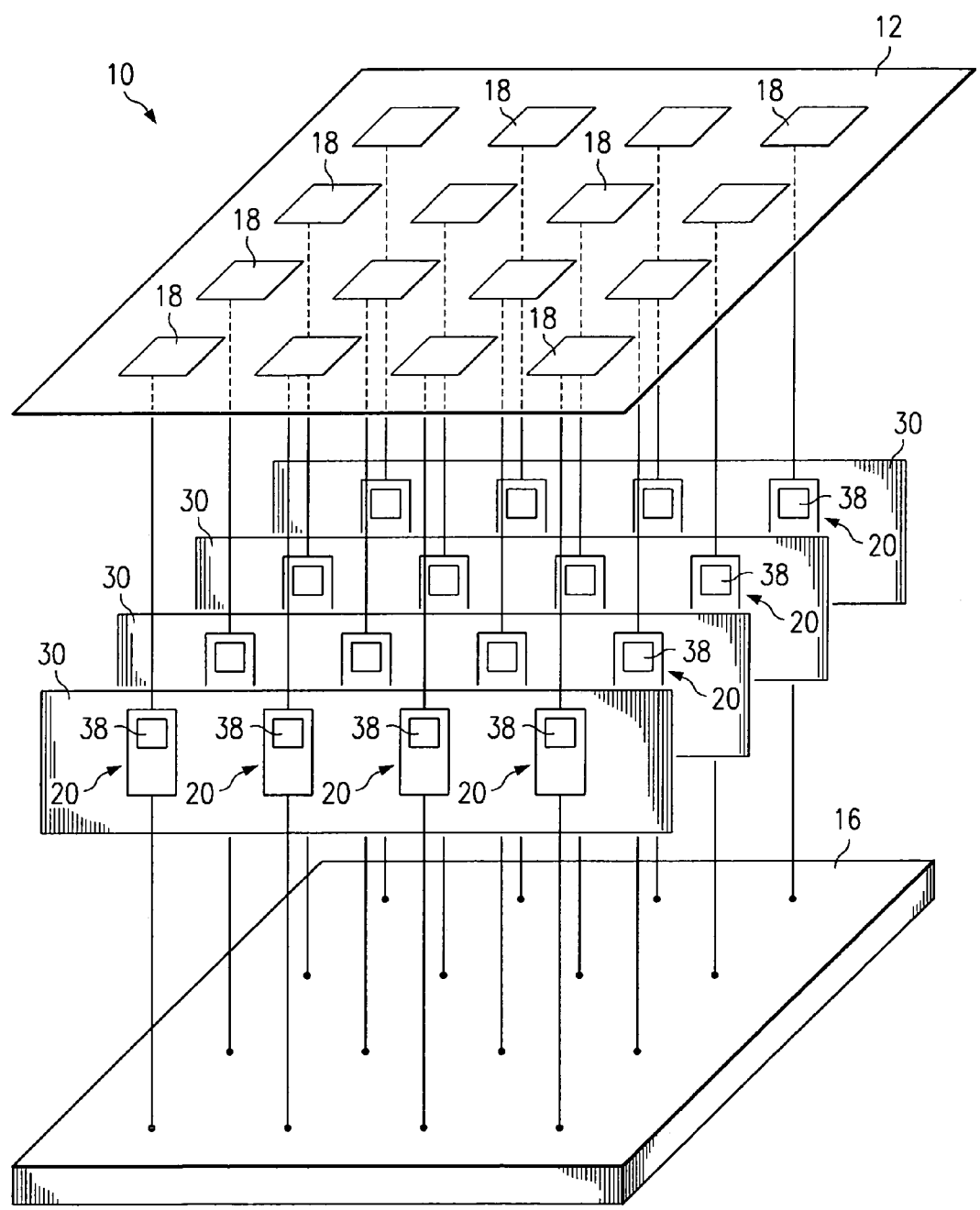
FIG. 1 is a diagrammatic perspective view of a phased array antenna system which embodies the present invention.

FIG. 1 is a diagrammatic perspective view of a phased array antenna system 10, including an antenna unit 12, server or devices 30 and a central control unit 16. Antenna unit 12 is coupled with devices 30, each of which is coupled with central control unit 16. Antenna unit 12 includes an array of dipoles 18 which are patch elements that include the capability to transmit and receive electromagnetic signals. Device 30 each include circuitry elements 20. Each circuitry element 20 is electrically coupled with an associated dipole 18. During operation of antenna system 10, central control unit 16 collects signals received by circuitry elements 20 from dipoles 18, and varies transmit signals fed from circuitry elements 20 to dipoles 18 so that beams originating from dipoles 18 can be formed in space and steered very rapidly in azimuth and elevation. The exemplary embodiment disclosed in FIG. 1 is an antenna system of the type commonly known as an active phased array antenna system.

In the embodiment of FIG. 1, circuitry elements 20 are transmit/receive (T/R) modules and contain monolithic microwave integrated circuits (MMICs) 38. T/R modules 20 process signals travelling to and from each of antenna unit 12 and central control unit 16. MMICs 38 generate a substantial amount of heat while antenna system 10 is operating. Accordingly, each device 30 includes an associated cooling system operable to remove heat generated by T/R modules 20 and MMICs 38, as discussed later.

Antenna system 10 relies on discreet, specified variations in the phase angle of signals sent from T/R modules 20 to dipoles 18, in order to precisely control the direction of the outgoing beams, and ensure accurate analysis of incoming beams. T/R modules 20 each introduce into signals passing therethrough a phase shift, which varies with temperature. For proper operation of the system, T/R modules 20 all need to be at approximately the same temperature, so that they all add about the same phase shift to each of the respective signals passing through them, which in turn will cause the unwanted additional phase shifts to all be roughly equal. The permissible temperature difference or gradient between any two T/R modules 20 decreases progressively as the operating frequency progressively increases. Excessive temperature gradients between any two or more T/R modules 20 will introduce significant different phase shifts into the associated signals and adversely affect the beams. Therefore, the cooling system is designed to remove heat from the device 30 in a manner which maintains an approximately isothermal temperature profile across T/R modules 20.

Figure 2:
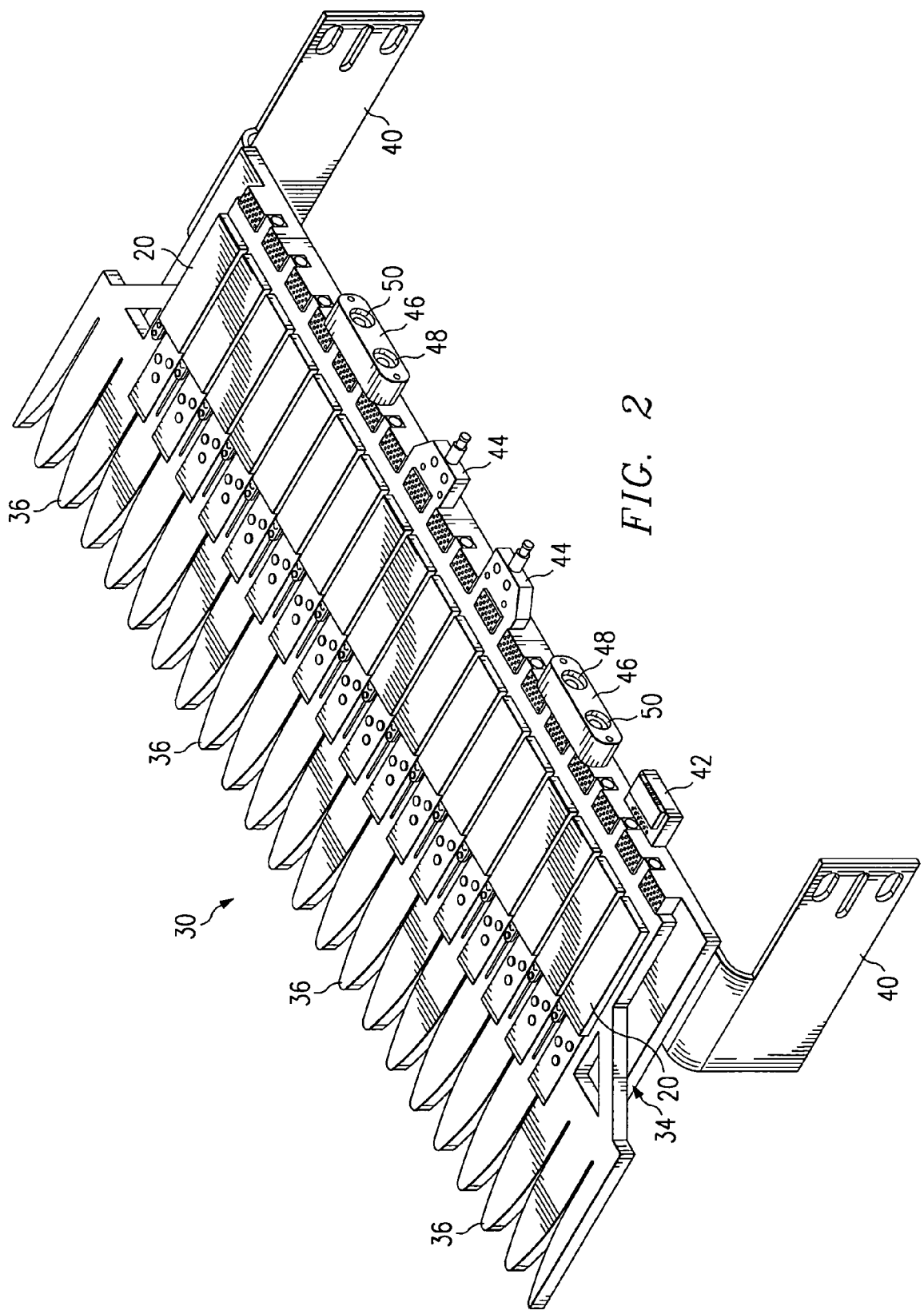
FIG. 2 is a diagrammatic perspective view of an apparatus which is part of the system of FIG. 1, which includes an electronic system and a slat assembly, and which embodies the present invention.

FIG. 2 is a diagrammatic perspective view of one of the devices 30, which includes an electronic system and which embodies aspects of the present invention. Transmit/receive (T/R) modules 20 of device 30 are mounted on a slat assembly 34 having a plurality of slats 36 extending therefrom. The material of the slat assembly 34 is an aluminum silicon carbide (AlSiC) metal matrix composite. The modules 20 and circuits 38 are mounted on slat assembly 34 using a silver epoxy adhesive, which has good thermal conductivity. This type of adhesive is more rigid than some other available adhesives, but as discussed below the present invention provides effective temperature control which substantially avoids thermal expansion and contraction that would stress the adhesive due to differing coefficients of thermal expansion of the slat assembly and the circuit components.

Each T/R module 20 contains an associated MMIC 38. The device 30 has at least one not-illustrated power interface, through which power is provided to the device 30, and thus to the T/R modules 20. Mounting brackets 40 are provided to mechanically secure the device 30 in place within the antenna system 10. An integrated logic interface 42 receives commands from the control unit shown at 16 in FIG. 1, which defines the operation of each T/R module 20. Radio Frequency (RF) interfaces 44 are used to electrically couple device 30 with the phased array antenna unit shown at 12 in FIG. 1.

Coolant interfaces 46 each include a respective inlet 48 and outlet 50, which form a portion of a cooling system integral to slat assembly 34. Inlets 48 and outlets 50 may be coupled with an external cooling system, or any fluid supply device which provides a continuous flow of a thermally conductive fluid. The cooling system disposed within slat assembly 34 will be described in more detail with regard to FIG. 3.

FIG. 3 is a diagrammatic perspective view, with portions broken away for clarity, of the device 30 of FIG. 2. In the illustrated embodiment, slat assembly 34 operates as a cold plate, to provide cooling to various electronic components 20 and 38 of device 30. Slat assembly 34 includes two integral cooling loops 52. Cooling loops 52 are formed within slat assembly 34 by embedding ⅛" stainless steel tubing within slat assembly 34, during fabrication of slat assembly 34. The location and configuration of cooling loops 52 are illustrated in FIG. 3 in broken lines.

The central openings through cooling loops 52 define continuous fluid passageways 54 within slat assembly 34. Fluid passageways 54 form paths of fluid communication between inlets 48 and outlets 50. Accordingly, cooling loops 52 may be coupled, using the interfaces 46, with external cooling systems 51 to provide fluid coolant to each inlet 48. In other words, each cooling system 51 is a fluid supply device to supply fluid coolant to an inlet 48. The coolant travels from each inlet 48 through passageway 54 to the corresponding outlet 50. A complete coolant loop is thereby formed allowing a continuous flow of fluid coolant to be provided through each cooling loop 52. The fluid coolant traveling through cooling loop 52 absorbs thermal energy generated by electronic components 20 and 38 of device 30. The amount of fluid provided for cooling is dictated by pressure drop and system capacity criteria. The high density packaging requirements of an active phased array antenna result in small volumes for cooling tubes which lead to reduced flow rates. The reduced flow rates then result in increased temperature rise in the fluid from inlet 48 to outlet 50.

T/R modules 20 and MMICs 38 (FIG. 2) are high power electronics components which dissipate a substantial amount of heat during operation. Slat assembly 34 includes thermally conductive materials which absorb heat generated by T/R modules 20 and MMICs 38. Thus, fluid coolant flowing through fluid passageways 54 absorbs heat from slat assembly 34 in order to maintain electronic components 20 and 38 within a predetermined temperature range.

The operating temperature of device 30 is critical to its operation for a number of reasons. For example, each T/R module 20 is very sensitive to temperature and operates most efficiently within a predetermined temperature range. Therefore, each cooling loop 52 is used to maintain modules 20 within a range which allows for the efficient operation of each T/R module 20.

Further, as discussed above, the T/R modules on the slat assembly add unwanted phase shifts to signals passing therethrough, and the amount of phase shift varies with temperature. Therefore, the temperature gradient between any T/R module 20 and any other T/R modules 20 must remain within a predetermined range of values. The allowable temperature gradient between any two T/R modules is based in part upon the operating frequency. For example, where T/R modules 20 are operating at a frequency of approximately 5 GHz, the maximum allowable temperature gradient across the array is approximately 20° C. In contrast, when operating is at a frequency of approximately 80 GHz, the maximum allowable temperature gradient across the array is approximately 1.3° C. The ideal temperature gradient between any two T/R modules 20 is equal to zero.

Accordingly, cooling loops 52 are configured to provide fluid coolant to portions of slat assembly 34 which absorb the most heat from T/R modules 20. By maintaining the temperature of slat assembly 34 generally constant throughout, excessive temperature gradients between any two T/R modules 20 are avoided. In other words, in order to maintain pairs of T/R modules 20 within predetermined temperature gradients, the temperature profile across slat assembly 34 must also be within a predetermined temperature range.

Therefore, cooling loops 52 are designed and configured to accomplish at least two goals: maintain electronics system 30 within a predetermined temperature range, and accomplish heat transfer between T/R modules 20 and the fluid coolant in a manner which prevents any two T/R modules 20 from exceeding a predetermined maximum temperature gradient.

As illustrated in FIG. 3, cooling loops 52 are approximately identical in size and configuration. Each cooling loop 52 conforms to an oval configuration. In practice, cooling loops 52 may alternatively be provided in any geometric configuration(s) which include one or more continuous fluid passageways 54 between respective inlets 48 and outlets 50. Additional design criteria regarding the size and configuration of cooling loops 52 will be discussed later in more detail.

Furthermore, the number of cooling loops 52 provided within a given slat assembly 34 may be significantly varied within the teachings of the present invention. In the embodiment of FIG. 3, two cooling loops 52 are provided. In another embodiment, a single cooling loop extending across the approximate area covered by cooling loops 52 of FIG. 3 may be used in lieu of two cooling loops 52. In still another embodiment, three or more cooling loops, each having an independent inlet and outlet, may be provided within slat assembly 34.

FIG. 4 is a diagrammatic, sectional view taken along line 4—4 of FIG. 3. The cross sectional shape of each cooling loop illustrated in FIG. 4 conforms to an oval configuration. In the illustrated embodiment, this configuration is achieved by deforming the stainless steel tubing used to form cooling loops 52. Cooling loops 52, which are initially round, are each compressed at an upper portion 58 and a lower portion 60 so as to flatten it slightly to decrease its dimension between 58 and 60. This allows each cooling loop 52 to fit more easily within thickness 64 of slat assembly 34. Stated differently, it permits the slat assembly 34 to be thinner. The size of the antenna elements 18 (FIG. 1) and the spacing between them both decrease progressively as the operating frequency is progressively increased. Since the slat assemblies are aligned with respective rows of antenna elements, the slat assemblies must be thinner for higher frequencies. A further advantage of the oval shape is that a particular size of tubing which may accommodate a higher volume of fluid coolant through cooling loops 52 may be selected, relative to the volume of flow available from round tubing having an equal thickness. However, in other embodiments, the cross-section of cooling loops 52 may conform to virtually any geometric configuration which will accommodate the flow of fluid coolant therethrough.

FIG. 5 is a diagrammatic sectional view taken along line 5—5 of FIG. 3, showing a portion of a cooling loop 52.

Cooling loops 52 include a plurality of constrictions 62. Constrictions 62 include reduced diameter portions of fluid passageways 54, which partially obstruct the path of fluid communication through fluid passageways 54. Constrictions 62 induce turbulence into the flow of fluid coolant through passageway 54 in order to avoid laminar flow characteristics of coolant through passageways 54.

Laminar flow through a circular tube is well understood theoretically for predicting pressure drop and heat transfer. Laminar flow is the result of low Reynolds number internal flows. Low Reynolds number flows through fluid passageways 54 may result from low flow rates of fluid coolant, and/or the use of high viscosity fluid coolant. For laminar flow, the velocity distribution of fluid transversely across a circular passageway is generally parabolic. The velocity of fluid coolant at the center of the fluid passageway is approximately twice the average velocity of fluid coolant. The velocity of fluid coolant closest to the wall of the fluid passageway approaches zero. Therefore, nearly stagnant fluid coolant nearest a surface 55 of the fluid passageway remains at a higher temperature than fluid coolant nearest a longitudinal centerline 66 of the fluid passageway. The higher temperature is a result of heat transfer from the wall to the fluid. In the illustrated embodiment, the surface 55 of fluid passageway 54 is the interior wall of the tubing which forms fluid passageway 54.

By inducing turbulent flow characteristics into the flow of fluid coolant through fluid passageway 54, a more uniform temperature distribution between the fluid coolant at the longitudinal centerline 66 and the fluid coolant nearest the surface of the fluid passageway is achieved. In other words, the temperature gradient throughout the cross-sectional area of the fluid passageway approaches zero. Accordingly, fluid coolant nearest the surface 55 of the fluid passageway 54 will attain lower temperatures for turbulent flow than laminar flow. This is because the turbulence mixes the fluid and thus produces throughout the fluid an approximately average temperature which is lower near surface 55 than is the case for laminar flow. Therefore, a more efficient cooling system is achieved, since cooler fluid coolant adjacent surfaces 55 will absorb more heat from portions of slat assembly 34 adjacent surface 55. The induced turbulence reduces the temperature gradient in the fluid near the tube surface 55 resulting in increased heat transfer for a given difference in temperatures between the fluid and the tube surface 55.

In the illustrated embodiment, fluid coolant enters inlet 48 at a predetermined temperature and continuously absorbs heat from portions of slat assembly 34 adjacent to fluid passageway 54. Therefore, the temperature of the fluid coolant continually rises as it flows through the passageway. Since the temperature of the fluid coolant is continually rising as it travels through fluid passageway 54, the ability of the fluid coolant to absorb heat from slat assembly 34 is diminished as the fluid coolant travels through fluid passageway 54, in the absence of turbulence. The diminished ability to remove heat results in locally increased temperatures in the assembly 34.

Constrictions 62 induce turbulence within the flow of fluid coolant through fluid passageways 54 by disrupting the boundary layer associated with laminar type flows. As fluid coolant travels through fluid passageway 54, fluid coolant closest to the surface of fluid passageway 54 is disrupted when it encounters constrictions 62. Accordingly, the fluid coolant closest to the surface of fluid passageway 54 is deflected toward the centerline 66 of fluid passageway 54. This deflection of fluid causes a mixing of fluid within fluid passageway 54, or induced turbulence.

Since turbulence causes a more uniform distribution of fluid coolant temperature within fluid passageway 54, the temperature of fluid coolant close to the surface of fluid passageway 54 will remain lower than that of fluid coolant close to the surface of a comparable fluid passageway exhibiting laminar flow characteristics. Accordingly, the efficiency of cooling provided by fluid coolant through passageway 54 is increased, since the cooler fluid coolant close to the surface of fluid passageway 54 will absorb more heat from adjacent portions of slat assembly 34 than would be absorbed for laminar flow.

In FIG. 5, each constriction 62 is longitudinally spaced along fluid passageway 54 from adjacent constrictions 62. The longitudinal distances 68 and 84–86 between adjacent constrictions 62 varies along the length of fluid passageway 54, between inlet 48 and outlet 50. The specific configuration of constrictions 62 within fluid passageway 54, and its advantages, are illustrated and discussed in more detail with regard to FIG. 6.

FIG. 6 is a diagrammatic plan view of cooling loop 52. Cooling loop 52 includes inlet 48, outlet 50, and fluid passageway 54 formed between inlet 48 and outlet 50. In FIG. 6, the distances 68–86 between adjacent constrictions 62 generally decrease as the distance from inlet 48 increases, with the shortest distance between adjacent constrictions occurring closest to outlet 50. However, the distances 69 and 81 are generally longer than adjacent distances 70–72 and 78–80, respectively. This is due in part to the presence of elbows 90 and 92. Elbows 90 and 92 tend to induce turbulence into the flow therethrough due to their configuration. Therefore, constrictions 62 need not be disposed within portions of passageway 54 within and immediately adjacent elbows 90 and 92.

The distances 68–73 occur between adjacent constrictions 62 nearest the inlet 48, along passageway 54. The distances 74–86 occur between constrictions 62 nearest outlet 50, along passageway 54. Since the distances 68–86 generally decrease along passageway 54 from inlet 48 to outlet 50, the average of the distances 68–73 is greater than the average of the distances 74–86. Accordingly, the amount of turbulence induced within coolant flow through fluid passageway 54 progressively increases as the temperature of the coolant travelling through passageway 54 progressively increases. This causes the fluid to absorb heat at approximately the same rate all along the passageway, as discussed below.

Due to the configuration and heat output of T/R modules 20 (FIG. 2), the amount of heat to be absorbed by fluid coolant from portions of slat assembly 34 adjacent to fluid passageway 54 is approximately constant along the length of fluid passageway 54. The variable decreasing distance between adjacent constrictions maintains a minimum temperature gradient across portions of slat assembly 34 which are adjacent to fluid passageway 54. Appropriate selection of the spacing between respective constrictions 62 allows heat transfer characteristics of the cooling system to be tailored to achieve a nearly isothermal surface temperature on portions of slat assembly 34 adjacent cooling loop 52.

In order to maintain an approximately isothermal temperature profile across all T/R modules 20 (FIG. 2), slat assembly 34 must remain at an approximately uniform temperature. In order to accomplish this, it is desirable to have the fluid coolant absorb heat from adjacent portions of slat assembly 34 at a constant rate along passageway 34. Since the temperature of the fluid coolant is rising as it travels through passageway 54, the temperature difference between the slat assembly and the fluid coolant decreases, which tends to decrease the rate at which the fluid coolant can absorb heat. By inducing progressively greater amounts of turbulence, the fluid coolant is able to continue to absorb heat at the desired rate, even though the fluid coolant is heating up.

In another embodiment, constrictions may be located based upon their proximity to various heat sources. For example, constrictions may be concentrated in areas adjacent to sections of slat assembly 34 which absorb the most heat from adjacent T/R modules. In other words, multiple, densely spaced constrictions may be located directly adjacent to larger and/or closely spaced T/R modules 20.

In order to maintain T/R modules 20 of FIG. 2 within predetermined temperature gradients with one another, constrictions 62 are provided in a manner so that the spacing between adjacent constrictions is smallest near the outlet, where temperatures of the fluid coolant are the highest. Accordingly, turbulent mixing of the fluid coolant increases in frequency as the temperature of the fluid coolant rises. In this manner, the temperature of the fluid coolant closest to the surface of fluid passageway 54 remains more uniform along the surface of fluid passageway 54. In other words, even though the temperature of the fluid coolant is continually rising, the temperature of the fluid coolant closest to the surface of fluid passageway 54 remains within a predetermined temperature range.

Accordingly, the teachings of the present invention are used to simultaneously control the operating temperature, heat transfer rate and temperature gradient between various components. In the illustrated embodiment, the temperature of the stainless steel tubing which forms fluid passageway 54 may be maintained within a 2° C. variation from inlet 48 to outlet 50, during operation of apparatus 30.

FIG. 7 is a diagrammatic plan view of a cooling loop 152 which is an alternative embodiment of the cooling loop 52. Cooling loop 152 includes an inlet 148, an outlet 150 and tubing which extends from inlet 148 to outlet 150. A plurality of constrictions 162 are provided in cooling loop 152, in order to induce turbulence within fluid coolant travelling through fluid passageway 154. In the embodiment of FIG. 7, constrictions 162 are approximately equally spaced from adjacent constrictions, along the length of the tubing. In other words, the distance between adjacent constrictions remains approximately constant from inlet 148 to outlet 150. The distance between constrictions 162 adjacent elbows 190 and 192 are greater, however, for those reasons previously discussed with regard to FIG. 5.

There are several reasons to provide a cooling loop 152 with approximately equal distances between adjacent constrictions 162 along the tubing. In one embodiment, cooling loop 152 will provide more efficient cooling to an associated component than a cooling loop without constrictions. Since turbulence induced within fluid passageway 154 will cause mixing of fluid coolant within fluid passageway 154, constrictions 162 will provide lower temperatures of fluid coolant nearest the surface of fluid passageway 154. This allows cooling loop 152 to absorb more heat from adjacent components than is possible with a cooling loop without constrictions.

Similarly, approximately equal distances between adjacent constrictions 162 are provided where more heat generating components are located adjacent the portions of fluid passageway 154 near inlet 148 than the portions of fluid passageway 154 near outlet 150. Maximum heat transfer is required in portions of fluid passageway 154 closest to inlet 148. Therefore, the increase in fluid coolant temperature as the fluid coolant approaches outlet 150 is not a problem, since less heat transfer is required within the portion of fluid passageway 154 closest to outlet 150.

Figure 8:
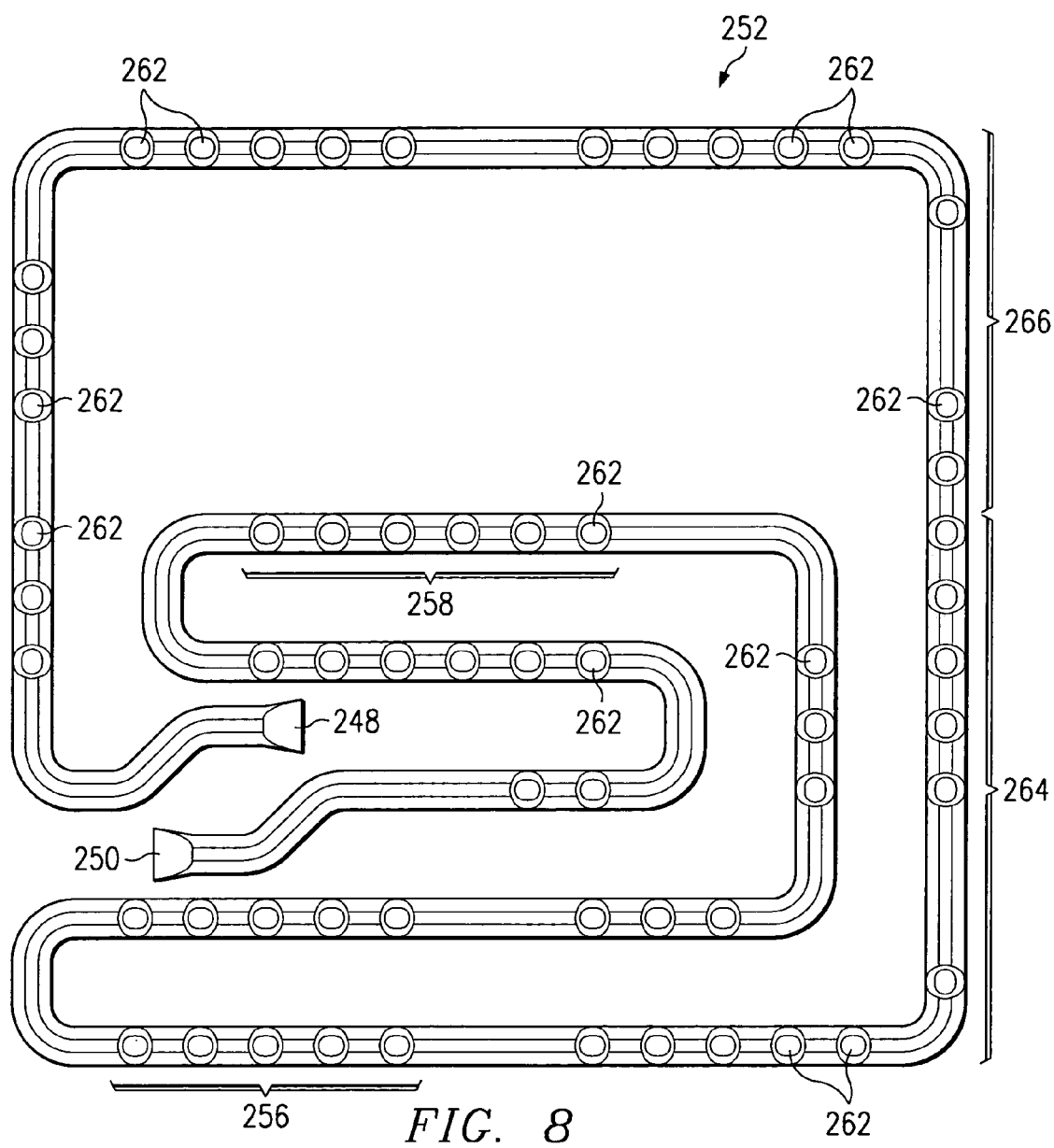
FIG. 8 is a diagrammatic plan view of a cooling loop according to yet another embodiment of the present invention.

FIG. 8 is a diagrammatic plan view of a cooling loop 252 which is a further alternative embodiment of the cooling loop 52, incorporating aspects of the present invention. Cooling loop 252 includes an inlet 248, an outlet 250 and serpentine tubing extending from inlet 248 to outlet 250. The tubing provides a path of fluid communication for a fluid coolant, between inlet 248 and outlet 250. A plurality of dimples 262 are formed upon the tubing which form protrusions within a fluid passageway within the tubing. Dimples 262 induce turbulence within fluid coolant flowing through the passageway, similar to constrictions 62 discussed with regard to FIGS. 5–6.

Dimples 262 are configured upon cooling loop 252 to provide increased turbulence within the flow of fluid coolant through the passageway, at locations where the most heat transfer will be required between cooling loop 252 and adjacent heat generating components. In other words, if the tubing will extend adjacent to a device which generates relatively high amounts of thermal energy, several dimples 262 may be provided very closely at that location upon cooling loop 252. Similarly, the tubing may be configured such that portions of the tubing pass directly underneath and/or immediately adjacent the areas where the most heat transfer will be required. For example, the tubing includes regions 256 and 258 having a large number of closely spaced dimples 262. Cooling loop 252 is configured such that regions 256 and 258 occur immediately adjacent electronic components which emit substantial thermal energy.

The configuration of cooling loop 252 may also correspond to the density of heat generating devices in adjacent equipment. For example, in the embodiment illustrated in FIG. 8, cooling loop 252 includes a larger volume of tubing concentrated at a lower portion 264 of cooling loop 252. In this embodiment, electronics or other heat generating devices may be concentrated upon equipment closest to lower portion 264. Conversely, upper portion 266 of cooling loop 252 includes less volume of tubing than lower portion 264. In this embodiment, a smaller amount of heat may be generated from equipment adjacent upper portion 266 than equipment adjacent lower portion 264.

The specific location of dimples 262 may be selected according to empirical data collected during the operation of a system incorporating cooling loop 252. In another embodiment, computational fluid dynamic studies may be used to predict the most efficient size and configuration of dimples.

Various turbulence inducing structures are available for use within the teachings of the present invention. For example, each of constrictions 62 and dimples 262 induce turbulence within their respective passageways 54 and 254. In practice, any structure which cooperates with fluid passageway 254 in order to induce turbulence into the flow of fluid coolant through the fluid passageway may fall within the teachings of the present invention. Several examples are discussed with regard to FIGS. 9–11, below.

Figure 9:
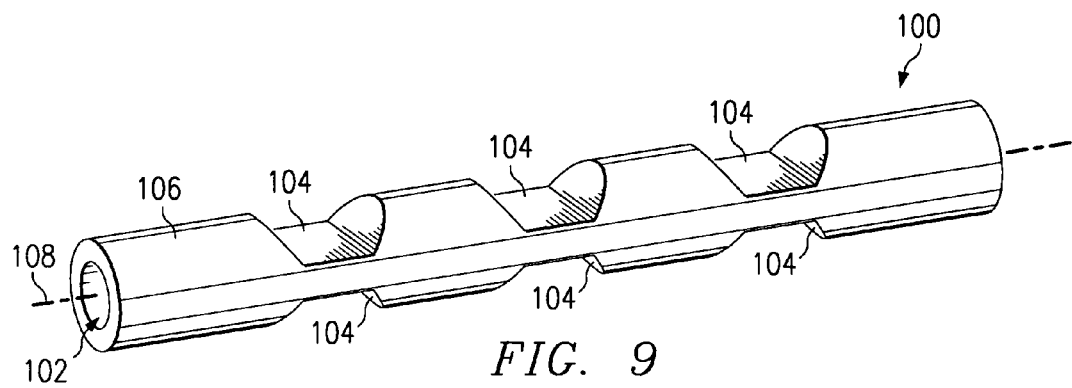
FIG. 9 is a diagrammatic perspective view of part of yet another alternative embodiment of a cooling loop.

FIG. 9 is a diagrammatic perspective view of a section of tubing 100, having a fluid passageway 102 disposed therethrough. A plurality of dimples 104 extend from a surface 106 of fluid passageway 102 toward a central, longitudinal axis 108 of fluid passageway 102. Dimples 104 induce turbulence into a flow of fluid coolant through passageway 102.

Dimples 104 of FIG. 9 conform to a generally notched configuration and may be formed by applying pressure to surface 106 with a pointed instrument, in order to deform tubing 100. In one embodiment, tubing 100 may be ⅛" stainless steel tubing. Stainless steel tubing is malleable enough to deform using pliers or another appropriate tool, yet strong enough to withstand the excessive temperature and pressure associated with the manufacturing process used to form slat assembly 34 (FIG. 2).

Figure 10:
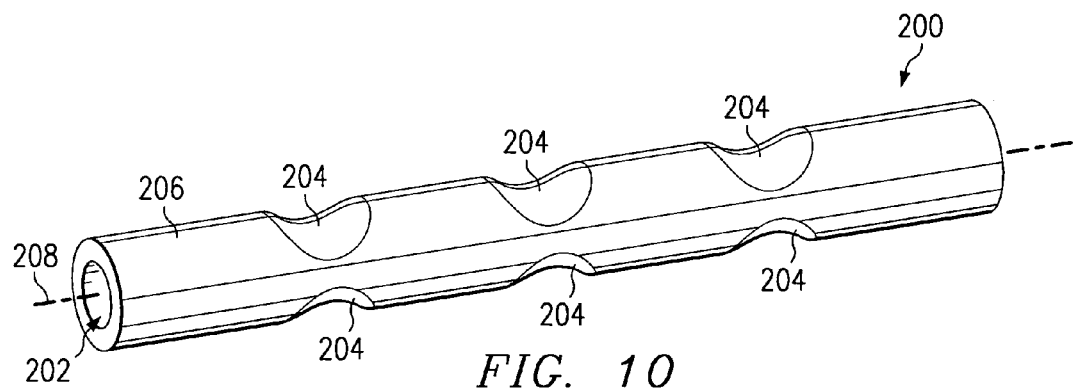
FIG. 10 is a diagrammatic perspective view of part of a cooling loop according to another embodiment of the present invention.

FIG. 10 is a diagrammatic perspective view of a section of tubing 200 which is an alternative embodiment of the tubing 100, and which embodies teachings of the present invention. Tubing 200 includes a fluid passageway 202 formed therethrough. A plurality of crimps 204 are formed upon tubing 200 which partially obstruct fluid passageway 202, in order to induce turbulence within fluid flow through fluid passageway 202. In this embodiment, each crimp 204 extends inwardly from a surface 206 of tubing 200, toward a longitudinal centerline 208. Each crimp 204 has a corresponding, diametrically opposed crimp 204 of a similar configuration. Crimps 204 of FIG. 10 may be formed by "crimping" tubing 200 at various locations along its length.

Figure 11:
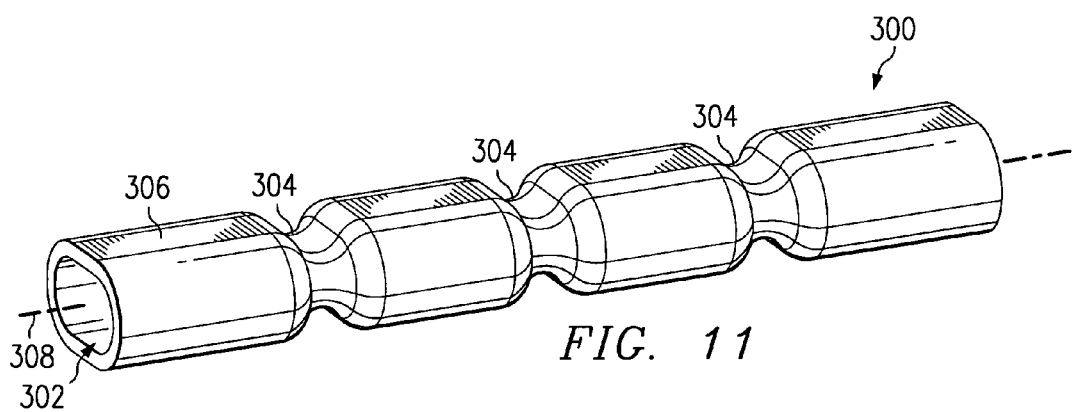
FIG. 11 is a diagrammatic perspective view of part of a cooling loop according to still another embodiment of the present invention.

FIG. 11 is a diagrammatic perspective view of a section of tubing 300 which is a further alternative embodiment of the tubing 100 and which embodies aspects of the present invention. Tubing 300 has a generally oval, cross-sectional shape. In practice, tubing 300 may be formed by compressing round tubing. Alternatively, tubing having an oval, cross-sectional shape may be manufactured for use within the teachings of the present invention. An oval tubing configuration may be desirable where the fluid passageway therethrough 302 must be provided with a limited thickness. This situation may occur when fluid passageway 302 will be formed within a very thin slat assembly. The oval cross section of fluid passageway 302 allows greater volume of fluid coolant to travel through a thin profile slat assembly.

All other things being relatively equal, tubing having a round cross section will generally be stronger than tubing having an oval cross section. However, oval tubing will accommodate a larger volume of fluid through a space with a limited thickness. Accordingly, the design of fluid passageway 302 should take this tradeoff into account.

A plurality of constrictions 304 extend from a surface 306 of tubing 300 toward a central axis 308 of tubing 300. Constrictions 304 form continuous annular rings which each extend along a perimeter of passageway 302, in a plane approximately perpendicular to the longitudinal axis 308 of passageway 302. As previously discussed with respect to FIG. 5, constrictions 304 are provided in order to induce turbulence into the flow of a fluid through fluid passageway 302.

Figure 12:
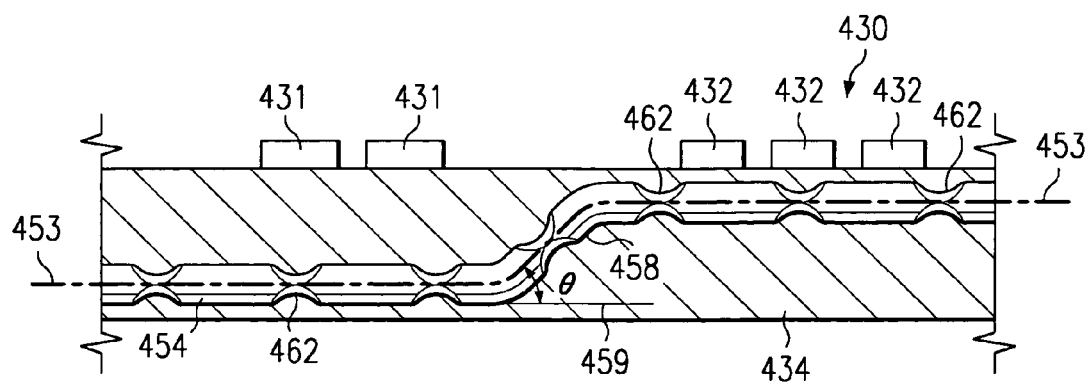
FIG. 12 is a diagrammatic cross section taken through an apparatus which is an alternative embodiment of the apparatus of FIG. 2, and which embodies aspects of the present invention.

FIG. 12 is a diagrammatic, cross sectional view of a system 430, in accordance with an alternative embodiment of the present invention. System 430 includes a plurality of heat generating devices 431 and 432 coupled with a thermally conductive plate 434. A fluid passageway 454 extends through portions of plate 434. Fluid passageway 454 forms a path of fluid communication between an inlet and an outlet of fluid passageway 454.

A plurality of turbulence inducing structures 462 are disposed within fluid passageway 454, and extend from a surface 455 of fluid passageway 454 toward a central axis 453 of fluid passageway 454. As previously illustrated and described, turbulence inducing structures 462 generate turbulent flow in response to a flow of fluid through fluid passageway 454.

Fluid passageway 454 is configured to provide relatively higher heat transfer to particular portions of plate 434. For example, heat generating devices 432 are greater in number and more densely grouped than heat generating devices 431. Therefore, a relatively greater amount of heat will be absorbed by plate 434 at those areas adjacent to heat generating devices 432.

Fluid passageway 454 includes a central portion 458 which forms an angle $\theta$ with respect to an imaginary horizontal axis 459. Accordingly, fluid passageway 454 is relatively closer to heat generating devices 432 than to heat generating devices 431. Therefore, heat transfer between fluid coolant and heat generating devices 432 will take place more efficiently than with heat generating devices 431. Also, the configuration of central portion 458 will induce turbulent flow characteristics into the flow of fluid through fluid passageway 454, since fluid passageway 454 is not configured as a straight, circular pipe.

In the embodiment of FIGS. 1–6, slat assembly 34 is formed from aluminum silicon carbide having stainless steel tubing embedded therein. Various other materials may be used for slat assembly 34 and/or cooling loop 52 within the teachings of the present invention. For example, various thermally conductive materials are available to form slat assembly 34.

Slat assembly 34 provides cooling to device 30, and also provides structural support for T/R modules 20. Therefore, the selection of material for forming slat assembly 34 should include these considerations. In other embodiments, material used to form slat assembly 34 may include various ceramics, cermets, copper infiltrated graphite, powdered metallurgy or other thermally conductive engineered composite materials.

Similarly, various thermally conductive materials are available for embedding within slat assembly 34 to form fluid passageway 54. Stainless steel provides many benefits because of its strength, high melting point, cost and availability. In the illustrated embodiment, the formation of slat assembly 34 requires very high temperatures and pressures. These criteria may be considered in selecting an appropriate material to embed within slat assembly 34 to form fluid passageway 54. However, copper, other metals and/or composite materials may be embedded within slat assembly 34 in order to form fluid passageway 54.

In an alternative embodiment of the present invention, the fluid passageway may be formed without the use of embedded tubing. For example, the fluid passageway may be formed as a void within a slat assembly during the fabrication process, using a die-cast or other cavity forming procedure. Alternatively, the fluid passageway may be formed within any given structure by drilling, grinding or some other boring procedure.

Various fluid coolants are available for use within the teachings of the present inventions. In the illustrated embodiments, polyalphaolifin (PAO) is used. However, other dielectric oils or ethylene glycol/water mixtures may be used within the teachings of the present invention.

The present invention provides a number of technical advantages. One such advantage results from use of turbulence inducing structures within a fluid passageway which induce turbulence in response to the flow of a fluid through the passageway. Turbulent flow characteristics have many advantages over laminar flow characteristics. For example, when a coolant fluid travels through a fluid passageway and turbulence is induced, a mixing occurs between the fluid nearest the central axis of the fluid passageway and the fluid nearest the surface of the fluid passageway. Accordingly, the fluid temperature nearest the surface of the fluid passageway is reduced which allows the coolant to absorb heat from adjacent components more efficiently.

Another technical advantage results from the use of different spacing between adjacent turbulence inducing structures along the fluid passageway. By varying the spacing between adjacent structures, turbulent flow may be introduced in a precise and accurate manner, to locations of a cooling system where a relatively large heat transfer is desirable. Accordingly, the specific number, size, configuration and location of structures may be selected to achieve a predetermined temperature profile across portions of a thermally conductive part adjacent the fluid passageway.

Yet another technical advantage results from use of progressively decreasing distances between adjacent turbulence inducing structures as the distance from an inlet of the fluid passageway increases. Since fluid coolant travelling through a passageway will inherently increase in temperature, more turbulence will typically be required at portions of the fluid passageway furthest from the inlet. In this manner, turbulent flow characteristics are progressively increased along the passageway to allow greater heat transfer from the coolant, as the temperature of the fluid increases.

Still another technical advantage of the present invention includes the determination of a specific configuration of the fluid passageway and the associated turbulence inducing structures, so as to provide a heat transfer profile which corresponds to the heat generating and absorption characteristics of adjacent thermally conductive parts. Accordingly, the temperature gradient between various components of a heat generating system may be maintained within a predetermined range of values.

Although several embodiments of the present invention have been illustrated and described in detail, it should be understood that various substitutions and alterations can be made thereto within departing from the scope of the invention. For example, the disclosed embodiments refer to a fluid passageway formed within a cold plate associated with an electronics system. The teachings of the present invention may be used in cooling and/or maintaining a predetermined maximum temperature gradient value in any discreet electronics components packaged at high densities, which require cooling. In fact, the teachings of the present invention may be incorporated into any fluid passageway in which locally increased turbulent flow characteristics are desired. Further, although the disclosed embodiments are intended to minimize temperature gradients within an apparatus, the present invention is equally suitable for maintaining a selective temperature difference between two points in an apparatus.

Although the present invention has been described in several embodiments, a myriad of changes and modifications will be apparent to one skilled in the art, and it is intended that the present invention encompass such changes and modifications as fall within the scope of the present appended claims.

What is claimed is:

1. An apparatus, comprising:
   a thermally conductive part having a fluid passageway formed therein, the fluid passageway having a fluid entrance and a fluid exit;
   turbulence inducing structure disposed along said passageway in a manner selected to achieve, in response to fluid flow through said fluid passageway, a predetermined temperature profile along said passageway in said thermally conductive part adjacent to said fluid passageway;
   wherein said structure includes a plurality of portions which each induce turbulence, wherein each said portion is longitudinally spaced along said passageway by a respective longitudinal distance from every other said portion which is adjacent thereto, wherein said fluid passageway includes a first section and a second section which are separate and which each include at least two of said portions, and wherein said longitudinal distances between said portions in said first section are greater than said longitudinal distances between said portions in said second section;
   wherein the longitudinal distance between the first section and the fluid entrance is less than the longitudinal distance between the second section and the fluid entrance; and
   wherein said part includes a cold plate.

2. An apparatus according to claim 1, wherein said portions includes protrusions extending from a surface of said fluid passageway toward a longitudinal, central axis of said fluid passageway.

3. An apparatus according to claim 1, wherein said portions includes an inwardly projecting annular protrusion formed along a perimeter of said passageway in a plane generally perpendicular to a longitudinal axis of said passageway.

4. An apparatus according to claim 1, wherein said cold plate is made of a material which includes aluminum silicon carbide (AlSiC).

5. An apparatus according to claim 1, wherein said part includes tubing at least partially embedded within said cold plate, said tubing having a generally oval cross section, and wherein said passageway extends through said tubing.

6. An apparatus according to claim 5, wherein said tubing is made of a material which includes stainless steel.

7. An apparatus according to claim 5, wherein said portions include crimps formed in said tubing, said crimps extending radially toward a longitudinal, central axis of said passageway.

8. An apparatus according to claim 5, wherein said portions include dimples formed upon said tubing, said dimples extending toward a longitudinal axis of said passageway.

9. An apparatus according to claim 5, further comprising a fluid supply device in fluid communication with said passageway for causing a thermally conductive fluid to flow through said passageway.

10. An apparatus according to claim 9, further comprising a plurality of electronic components thermally coupled with said part, said components generating heat which is transferred to said fluid through said part.

11. An apparatus according to claim 10, wherein said part, said structure, and said electronic components are portions of a phased array antenna system.

12. An apparatus according to claim 10, wherein said temperature profile is generally isothermal.

13. An apparatus according to claim 1, wherein said portions include first and second protrusions extending inwardly into said passageway from a surface of said passageway, said first protrusion being generally opposite said second protrusion along a perimeter of said passageway in a plane approximately perpendicular to a longitudinal axis of said passageway.

14. An apparatus, comprising:
   a thermally conductive flat plate having a fluid passageway formed therein, the fluid passageway having a fluid entrance and a fluid exit;
   a plurality of turbulence inducing structures disposed along said fluid passageway, wherein locations of said structures are selected to achieve, in response to fluid flow through said fluid passageway, a predetermined temperature profile along said passageway in said plate adjacent to said fluid passageway;
   wherein said plurality of turbulence inducing structures includes a plurality of portions which each induce turbulence, wherein each said portion is longitudinally spaced along said passageway by a respective longitudinal distance from every other said portion which is adjacent thereto, wherein said fluid passageway includes a first section and a second section which are separate and which each include at least two of said portions, and wherein said longitudinal distances between said portions in said first section are greater than said longitudinal distances between said portions in said second section; and
   wherein the longitudinal distance between the first section and the fluid entrance is less than the longitudinal distance between the second section and the fluid entrance.

15. An apparatus according to claim 14, wherein each said structure is longitudinally spaced along said passageway by a respective longitudinal distance from every other said structure which is adjacent thereto, and wherein the lengths of said longitudinal distances vary along said passageway.

16. An apparatus according to claim 14, wherein said portions each include an annular protrusion extending into said passageway.

17. An apparatus according to claim 14, further comprising a plurality of electronic devices coupled with a first face of said plate.

18. A method of maintaining a predetermined temperature profile along material of a thermally conductive part adjacent a fluid passageway formed within said part, the fluid passageway having a fluid entrance and a fluid exit; comprising:
   providing turbulence inducing structure within said fluid passageway; and
   selecting a configuration of said structure to achieve, in response to fluid flow through said fluid passageway, the predetermined temperature profile along said passageway in said part adjacent to said fluid passageway;
   configuring said structure to include a plurality of portions which each induce turbulence, said passageway having first and second sections which are separate and which each include at least two of said portions;
   selecting locations of said portions along said passageway such that each said portion is longitudinally spaced by a respective longitudinal distance from every other said portion which is adjacent thereto, wherein said longitudinal distances between said portions in said first section of said passageway are greater than said longitudinal distances between said portions in said second section of said passageway; and wherein the longitudinal distance between the first section and the fluid entrance is less than the longitudinal distance between the second section and the fluid entrance.

19. An apparatus, comprising:

a thermally conductive part having a fluid passageway formed therein, the fluid passageway having a fluid entrance and a fluid exit;

turbulence inducing structure disposed along said passageway in a manner selected to achieve, in response to fluid flow through said fluid passageway, a predetermined temperature profile along said passageway in said thermally conductive part adjacent to said fluid passageway;

wherein said structure includes a plurality of portions which each induce turbulence, wherein each said portion is longitudinally spaced along said passageway by a respective longitudinal distance from every other said portion which is adjacent thereto, wherein said fluid passageway includes a first section and a second section which are separate and which each include at least two of said portions, and wherein said longitudinal distances between said portions in said first section are greater than said longitudinal distances between said portions in said second section;

wherein the longitudinal distance between the first section and the fluid entrance is less than the longitudinal distance between the second section and the fluid entrance; and wherein said portions include protrusions extending from a surface of said fluid passageway toward a longitudinal, central axis of said fluid passageway.

20. An apparatus, comprising:

a thermally conductive part having a fluid passageway formed therein, the fluid passageway having a fluid entrance and a fluid exit;

turbulence inducing structure disposed along said passageway in a manner selected to achieve, in response to fluid flow through said fluid passageway, a predetermined temperature profile along said passageway in said thermally conductive part adjacent to said fluid passageway;

wherein said structure includes a plurality of portions which each induce turbulence, wherein each said portion is longitudinally spaced along said passageway by a respective longitudinal distance from every other said portion which is adjacent thereto, wherein said fluid passageway includes a first section and a second section which are separate and which each include at least two of said portions, and wherein said longitudinal distances between said portions in said first section are greater than said longitudinal distances between said portions in said second section;

wherein the longitudinal distance between the first section and the fluid entrance is less than the longitudinal distance between the second section and the fluid entrance; and wherein said portions include an inwardly projecting annular protrusion formed along a perimeter of said passageway in a plane generally perpendicular to a longitudinal axis of said passageway.

* * * * *